United States Patent [19]

Sugiura

[11] Patent Number: 4,980,733

[45] Date of Patent: Dec. 25, 1990

[54] SEMICONDUCTOR STORAGE DEVICE

[75] Inventor: Souichi Sugiura, Yokohama, Japan

[73] Assignee: Kabushiki Kaisha Toshiba, Kawasaki, Japan

[21] Appl. No.: 285,939

[22] Filed: Dec. 19, 1988

[30] Foreign Application Priority Data

Dec. 28, 1987 [JP] Japan .................................. 62-334715

[51] Int. Cl.⁵ ...................... H01L 27/10; H01L 29/44
[52] U.S. Cl. .................................... 357/23.6; 357/51; 357/71
[58] Field of Search .......................... 357/23.6, 51, 71

[56] References Cited

U.S. PATENT DOCUMENTS 4,012,757  3/1977  Koo ..................................... 357/23.6
4,622,570  11/1986  Taguchi ............................. 357/23.6

Primary Examiner—Jerome Jackson, Jr.
Attorney, Agent, or Firm—Finnegan, Henderson, Farabow, Garrett, and Dunner

[57] ABSTRACT

A semiconductor storage device in which plural pairs of cell capacitors arranged in a matrix arrangement on a semiconductor substrate and the plural pairs of cell capacitors are arranged on each row with cell regions placed between the pairs of cell capacitors. This semiconductor storage device is constructed such that a pair of cell capacitors on a given row are connected by a cell plate electrode with other cell capacitors on one diagonal line prolonged from the said pair of cell capacitors but are not connected with the cell capacitors on the other diagonal line.

4 Claims, 4 Drawing Sheets

SEMICONDUCTOR STORAGE DEVICE

BACKGROUND OF THE INVENTION

1. Field of the Invention

This invention relates to a semiconductor storage device featuring the improved construction of the cell plate electrode of the memory cell capacitor. There has been a progressive increase in the device density in integrated circuits of dynamic RAMs and consequently, minute processing is required in this field.

2. Description of the Related Art

Normally, a memory cell capacitor used in a dynamic RAM comprises a semiconductor substrate, an insulator coating formed on the substrate, and a cell plate electrode made of a polysilicon layer, for example, formed on the insulator coating. FIG. 1 is a plan view showing a part of the integrated circuit pattern of a conventional RAM. Cell regions 8, in a long and substantially hexagonal shape where circuits are arranged, are formed in the semiconductor substrate as described below.

Plural cell regions 8 are formed by a photolithographic technique, for example, with their longitudinal directions aligned with the direction of a first row in such a way that they look as if they are windows on the substrate. In the next row, cell regions 8 are formed such that they are placed in those positions of this next row which correspond to the positions of the first row where there are no cell regions between cell regions 8. As a result, plural cell regions 8 are formed alternately for a plurality of rows on the substrate and they look like windows disposed in a matrix arrangement.

Referring to FIG. 1, in the area of a row where there is no cell region 8, cell capacitors 1 and 2 are formed facing each other and are separated by a specified distance. In those areas of the adjacent rows which are located on both sides of cell region 8 in the row having cell capacitors 1 and 2, cell capacitors 3 and 4, 5 and 6 are disposed.

As mentioned earlier, cell plate electrode 7 is placed on the memory cell capacitors. In FIG. 1, cell plate electrode 7 is located on cell capacitors 3, 4, 5 and 6. Cell plate electrode 7 on cell capacitors 1 and 2 which face each other continues to the cell plate electrode on cell capacitors 3, 6 and 4, 5 on the adjacent rows and on the diagonal lines prolonged from oppose cell capacitors 1 and 2.

The hiderances in the way of further increasing the circuit density of conventional dynamic RAMs are as follows.

As described above, cell plate electrode 7 conventionally covers from aforementioned cell capacitors 1 and 2 to other cell capacitors 3, 6 and 4, 5 on the adjacent rows and on the prolonged diagonal lines. Therefore, cell plate electrode 7 occupies a very large area, limiting the circuit areas for cell regions 8. Conventionally, cell regions 8 have in a long hexagonal shape and are disposed on the semiconductor substrate like windows scattered thereon. It has been difficult to form cell regions in such a shape by photolithographic techniques and more difficult to make them in reduced shapes.

SUMMARY OF THE INVENTION

The object of this invention is to provide a semiconductor storage device having a cell plate electrode construction which has overcome the above-described conventional disadvantage and permits high-density circuit integration.

In order to achieve the above object, a semiconductor storage device according to this invention comprises a semiconductor substrate; a plurality of pairs of cell capacitors formed on said semiconductor substrate in a matrix fashion, the cell capacitors of each pair being arranged on the same row and spaced apart from each other, and each pair of cell capacitors being spaced apart from any adjacent pair on the same row by a cell region and located beside the cell region arranged on at least one of the adjacent two rows, and each cell region being located beside the pair of cell capacitors arranged on at least one of the adjacent two rows; and a cell plate electrode, located on the cell capacitors and formed in a shape continuously covering from each of the said pair of cell capacitors on the row to that pair of cell capacitors on an adjacent row which is on one of the diagonal lines prolonged from the said pair of cell capacitors but not continuously extending to a pair of cell capacitors on the other prolonged diagonal line.

By using a cell plate electrode of the improved construction according to this invention, it is possible to obtain semiconductor storage devices having an increased cell region for circuit formation and which is suitable for higher-density circuit integration.

DETAILED DESCRIPTION OF THE PREFERRED EMBODIMENTS

An embodiment of this invention will be described with reference to the accompanying drawings.

Figure 2:
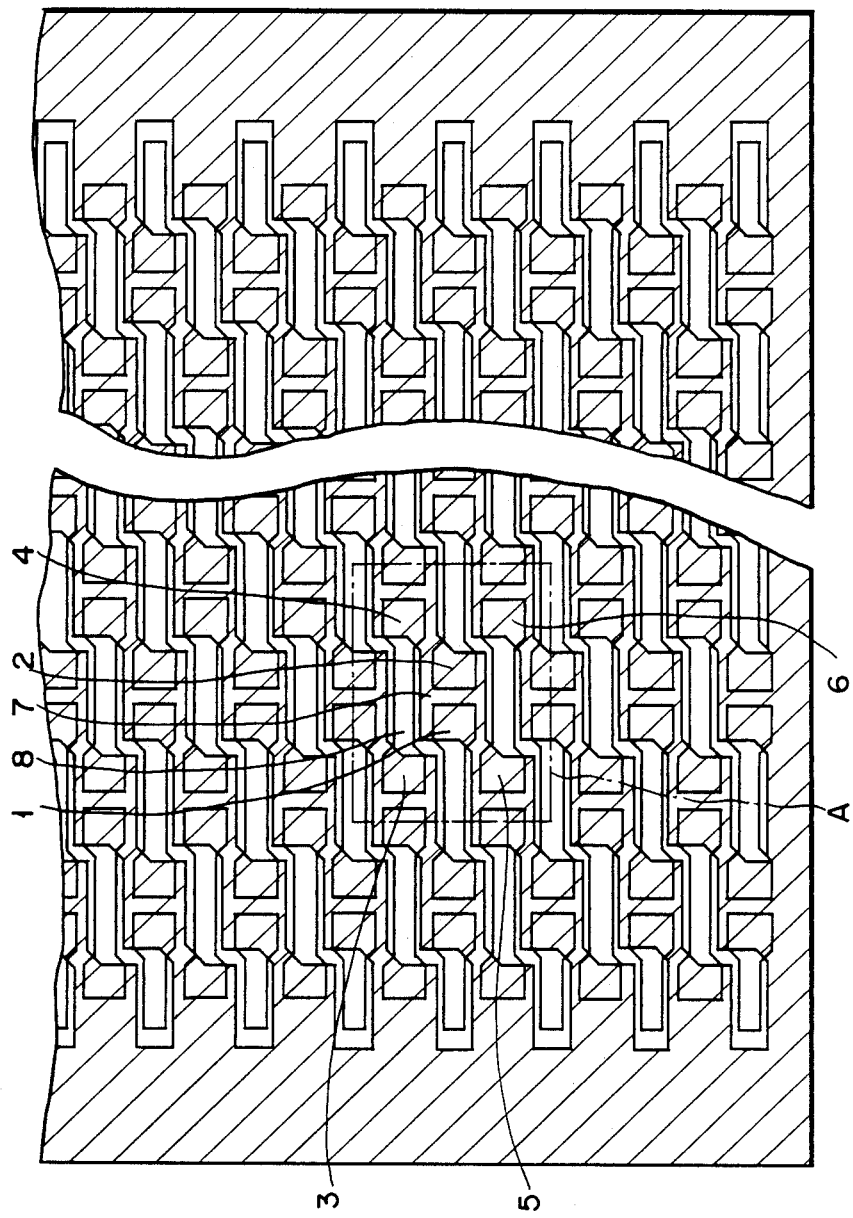
FIG. 2 is a plan view showing the configuration of the cell plate electrode of a dynamic RAM according to an embodiment of this invention.

Referring to FIG. 2, pairs of cell capacitors are arranged on a row and pairs of cell capacitors on the adjacent rows are arranged on both sides of the cell regions on the row. In this way, pairs of cell capacitors and cell regions are arranged in a matrix arrangement in the whole area of a dynamic RAM.

Figure 1:
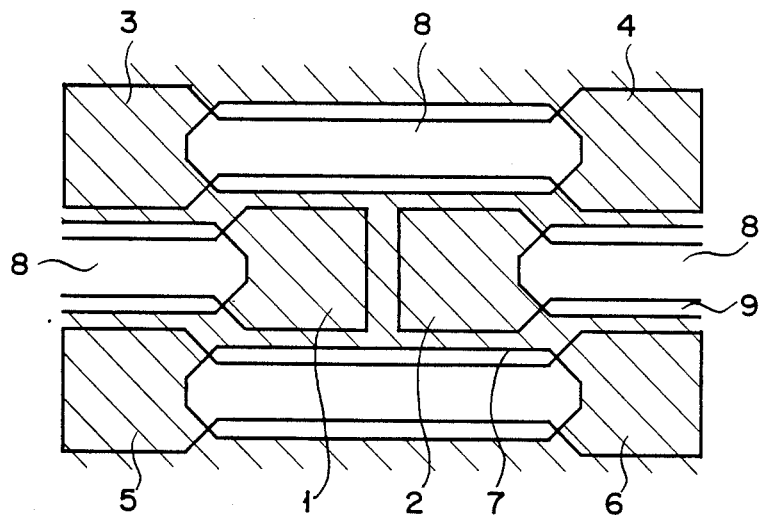
FIG. 1 is a plan view of a part of a conventional dynamic RAM integrated circuit.

The hatched portion of FIG. 1 indicates the cell plate electrode. The plan view of the enclosed part A of FIG. 2 is shown, on an enlarged scale, in FIG. 3.

Figure 3:
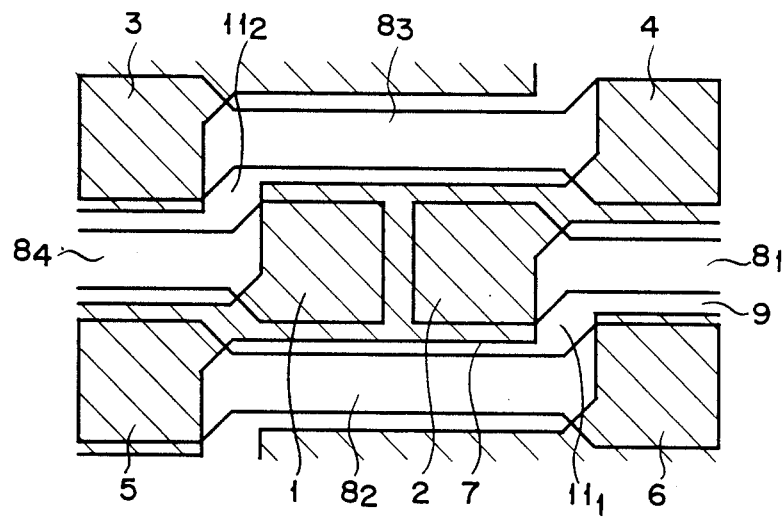
FIG. 3 is a plan view showing the enclosed part A of FIG. 2.

In FIG. 3, those parts which are identical with those of FIG. 1, which is the plan view of a conventional RAM pattern, are given the same numerals and will not be described. The characteristic of this embodiment is that cell plate electrode 7 covers only cell capacitors 4 and 5 on one diagonal line prolonged from cell capacitors 1 and 2 facing each other and separated by a specified distance on a row, out of cell capacitors 3, 6 and 4, 5 located on the rows on both sides of the row which contains cell capacitors 1 and 2 and on the two diagonal lines from the pair of cell electrodes 1 and 2.

As is clear from FIG. 3, cell capacitors 1 and 2 are not connected by the cell plate electrode 7 to cell capacitors 3 and 6 on the other diagonal line from cell electrodes 1 and 2 and therefore, there are portions devoid of cell plate electrode 7 and indicated by the numerals $11_1$ and $11_2$. By forming a circuit section in those portions, the density of the integrated circuit can be increased. The numeral 9 indicates the cell separating region. According to the above-mentioned construction, a linear cell region is formed jointly by cell regions $8_1$ and $8_2$ with a portion devoid of cell plate electrode 7 present in between. Minute cell regions can be formed more easily by a photolithographic technique in a linear form than in a pattern having cell regions scattered like windows.

With the cell plate electrode described above, every part thereof can be at the same potential by connection at suitable points on the semiconductor substrate.

Figure 4:
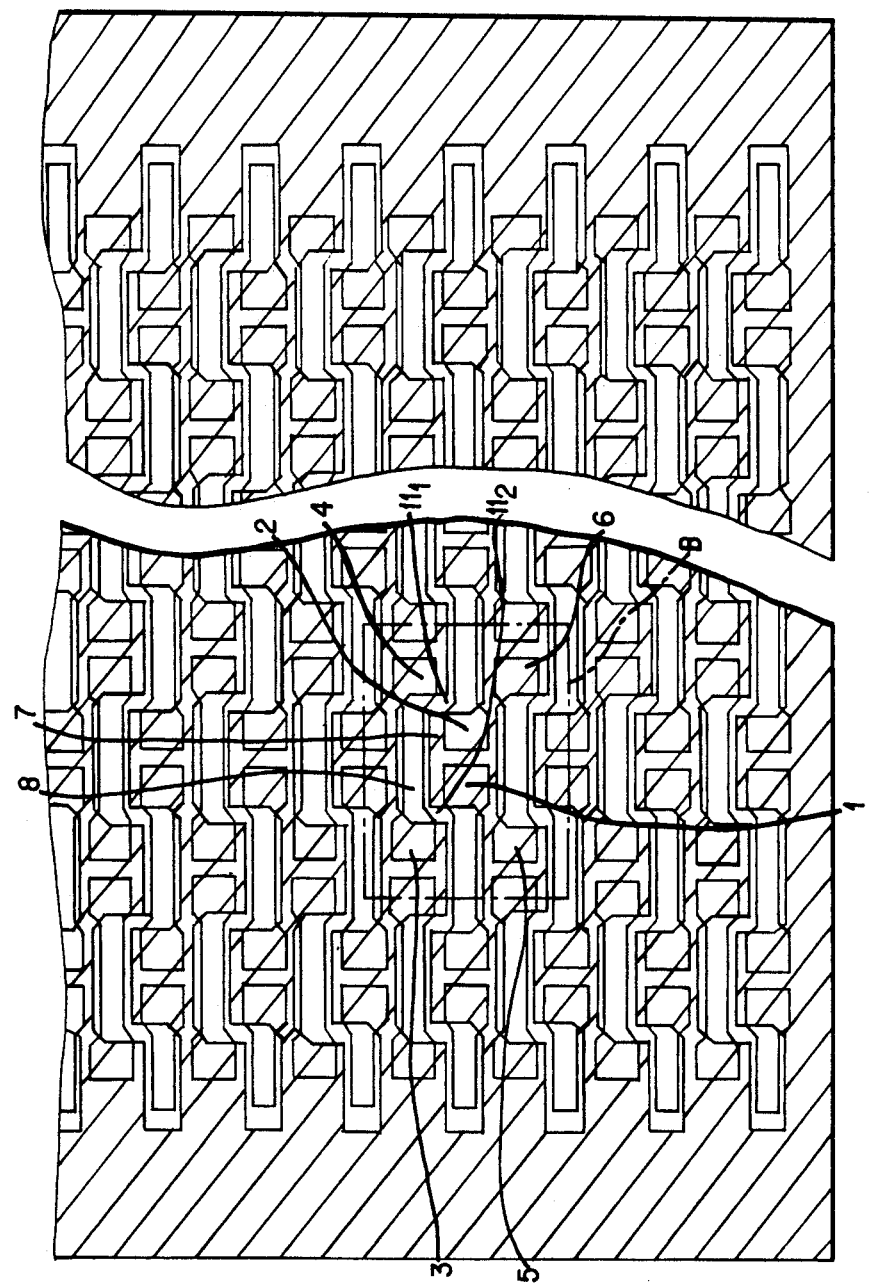
FIG. 4 is a plan view showing another configuration of the cell plate electrode of the dynamic RAM according to this invention.
Figure 5:
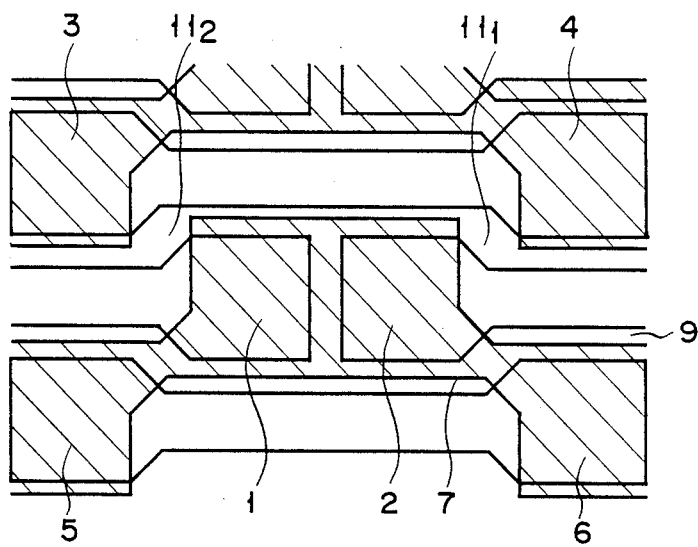
FIG. 5 is a plan view showing the enclosed part B of FIG. 4.

FIG. 4 shows another embodiment of this invention. Those parts which are identical with those of FIG. 2 are given the same numerals and will not be described again. FIG. 5 is a plan view showing the enclosed part B of FIG. 4. This embodiment is characterized in that cell plate electrode 7 that covers a pair of cell capacitors 1 and 2 facing each other on a given row continues to cell plate electrode 7 on cell capacitors 5 and 6 on an adjacent row but does not continue to cell capacitors 3 and 4 on the other adjacent row. The numerals $11_1$ and $11_2$ indicate the portion devoid of cell plate electrode 7. If this construction is used, cell plate electrode 7, though it appears to be divided into separate pieces, can be set at the same potential at every piece thereof by connection at suitable points on the semiconductor substrate as in the embodiment shown in FIGS. 2 and 3.

Also in the embodiment described above, as portions $11_1$ and $11_2$, devoid of cell plate electrode 7, are provided, the area of the cell regions can be increased and thereby semiconductor storage devices suitable for higher-density integration can be obtained.

What is claimed is:

1. A semiconductor storage device comprising:
a semiconductor substrate;
a plurality of pairs of cell capacitors formed in a matrix of rows and columns on said semiconductor substrate, the cell capacitors of each pair being arranged on the same row;
a plurality of cell regions disposed along said rows, separating said pairs of cell capacitors in said rows;
a first row of said matrix having a plurality of pairs of cell capacitors, each of said pairs of cell capacitors in said first row being disposed in columns;
second and third rows of said matrix, each of said second and third rows being adjacent to said first row, and each of said second and third rows having pairs of cell capacitors which are adjacent to said cell regions of said first row; and
a cell plate electrode located on said pairs of cell capacitors of said first row, and formed in a shape continuously covering each of said pairs of cell capacitors of said first row and a pair of cell capacitors in said second row and a pair of cell capacitors in said third row, but not covering more than one pair of said cell capacitors in the same column of the first, second and third rows.

2. The semiconductor storage device according to claim 1, wherein said cell plate electrode is the electrode of the capacitors for data storage of a dynamic RAM.

3. A semiconductor storage device comprising: a semiconductor substrate;
a plurality of pairs of cell capacitors formed in a matrix of rows and columns on said semiconductor substrate, the cell capacitors of each pair being arranged in the same row, facing each other and separated from each other by a predetermined distance;
a plurality of cell regions arranged in said rows and disposed adjacent to pairs of cell capacitors in said rows, and serving as circuit areas for said plurality of pairs of cell capacitors;
a first row of said matrix having a plurality of pairs of cell capacitors and a plurality of cell regions;
second and third rows of said matrix each with a plurality of pairs of cell capacitors and a plurality of cell regions, and each of said second and third rows being adjacent to said first row, where said pairs of cell capacitors in the first row are adjacent to said cell regions in said second and third rows; and
a cell plate electrode located on said pairs of cell capacitors disposed in said first row, and formed in a shape continuously covering said pairs of cell capacitors in said second row, but not covering said pairs of cell capacitors in said third row.

4. The semiconductor storage device according to claim 3, wherein said cell plate electrode is the electrode for data storage of a dynamic RAM.

* * * * *